(12) United States Patent
Fukazawa

(10) Patent No.: US 7,074,703 B2
(45) Date of Patent: Jul. 11, 2006

(54) SEMICONDUCTOR DEVICE AND METHOD OF MANUFACTURING THE SAME, CIRCUIT BOARD, AND ELECTRONIC INSTRUMENT

(75) Inventor: Motohiko Fukazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/862,416

(22) Filed: Jun. 8, 2004

(65) Prior Publication Data

US 2005/0051883 A1 Mar. 10, 2005

(30) Foreign Application Priority Data

Jun. 19, 2003 (JP) .............................. 2003-175323

(51) Int. Cl.
*H01L 21/44* (2006.01)

(52) U.S. Cl. ...................................... 438/598; 438/107
(58) Field of Classification Search ................ 438/109, 438/113, 620, 667, 672, 928, 977, 598, 106, 438/107; 257/698, 777

See application file for complete search history.

(56) References Cited

U.S. PATENT DOCUMENTS

| 6,331,208 B1* | 12/2001 | Nishida et al. ................ 117/89 |
| 6,657,306 B1* | 12/2003 | Sasaki et al. ................ 257/773 |
| 6,734,084 B1* | 5/2004 | Nemoto et al. ............. 438/466 |
| 6,809,421 B1* | 10/2004 | Hayasaka et al. ........... 257/777 |
| 2005/0017338 A1 | 1/2005 | Fukazawa |

FOREIGN PATENT DOCUMENTS

JP    A 2001-127242    5/2001

* cited by examiner

*Primary Examiner*—Tuan H. Nguyen
(74) *Attorney, Agent, or Firm*—Oliff & Berridge, PLC

(57) ABSTRACT

A method of manufacturing a semiconductor device includes: (a) forming a first resin layer on a first surface of a semiconductor substrate, an integrated circuit being formed in the first surface of the semiconductor substrate; (b) forming a through-hole electrode including a projecting section which projects from a second surface opposite to the first surface by removing a part of the semiconductor substrate from the second surface so as to thin the semiconductor substrate; and (c) forming a second resin layer on the second surface of the semiconductor substrate so as to avoid the projecting section.

11 Claims, 7 Drawing Sheets

SEMICONDUCTOR DEVICE AND METHOD OF MANUFACTURING THE SAME, CIRCUIT BOARD, AND ELECTRONIC INSTRUMENT

Japanese Patent Application No. 2003-175323, filed on Jun. 19, 2003, is hereby incorporated by reference in its entirety.

BACKGROUND OF THE INVENTION

The present invention relates to a semiconductor device and a method of manufacturing the same, a circuit board, and an electronic instrument.

A semiconductor device in three-dimensional mounting form has been developed. It is known in the art that through-hole electrodes are formed in semiconductor chips, and the upper and lower through-hole electrodes are bonded by stacking the semiconductor chips. The space between the stacked semiconductor chips is filled with a resin (underfill material). However, warping or cracks may occur in one of the semiconductor chips due to stress caused by cure shrinkage of the resin. In particular, since the resin is provided on only one side (lower side) of the uppermost semiconductor chip, stress caused by cure shrinkage of the resin is applied from one side, whereby warping or cracking of the semiconductor chip is promoted.

BRIEF SUMMARY OF THE INVENTION

According to one aspect of the present invention, there is provided a method of manufacturing a semiconductor device, comprising:

(a) forming a first resin layer on a first surface of a semiconductor substrate, an integrated circuit being formed in the first surface of the semiconductor substrate;

(b) forming a through-hole electrode including a second projecting section which projects from a second surface opposite to the first surface by removing a part of the semiconductor substrate from the second surface so as to thin the semiconductor substrate; and (c) forming a second resin layer on the second surface of the semiconductor substrate with at least a part of a surface of the second projecting section being exposed.

According to another aspect of the present invention, there is provided a semiconductor device comprising:

a semiconductor substrate which includes a first surface and a second surface, an integrated circuit being formed in the first surface, the second surface being opposite to the first surface;

a through-hole electrode which includes a first projecting section projected from the first surface, and a second projecting section projected from the second surface;

a first resin layer formed on the first surface of the semiconductor substrate so as to avoid the first projecting section; and a second resin layer which is formed on the second surface of the semiconductor substrate with at least a part of a surface of the second projecting section being exposed.

According to a further aspect of the present invention, there is provided a semiconductor device comprising:

a plurality of the above described semiconductor devices, the semiconductor devices being stacked, wherein adjacent semiconductor devices among the stacked semiconductor devices are electrically connected with each other through the through-hole electrode.

According to still another aspect of the present invention, there is provided a circuit board on which one of the above described semiconductor devices is mounted.

According to a still further aspect of the present invention, there is provided an electronic instrument comprising one of the above described semiconductor devices.

DETAILED DESCRIPTION OF THE EMBODIMENT

Figure 1A:
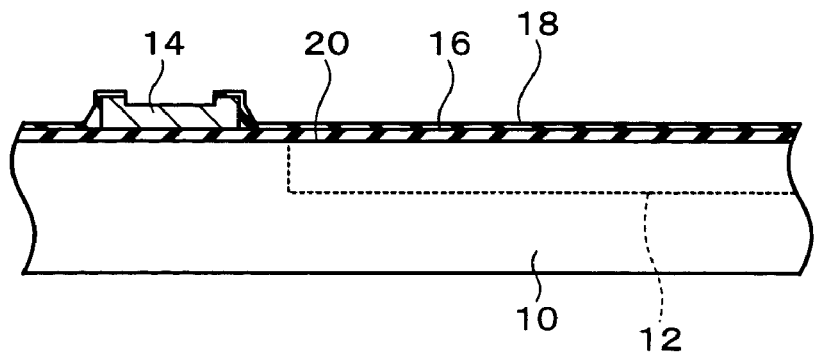
FIGS. 1A to 1D are views illustrating a method of manufacturing a semiconductor device according to an embodiment of the present invention.

An objective of the present invention is to improve reliability of a semiconductor device and a method of manufacturing the same, a circuit board, and an electronic instrument.

(1) According to one embodiment of the present invention, there is provided a method of manufacturing a semiconductor device, comprising:

(a) forming a first resin layer on a first surface of a semiconductor substrate, an integrated circuit being formed in the first surface of the semiconductor substrate;

(b) forming a through-hole electrode including a second projecting section which projects from a second surface opposite to the first surface by removing a part of the semiconductor substrate from the second surface so as to thin the semiconductor substrate; and (c) forming a second resin layer on the second surface of the semiconductor substrate with at least a part of a surface of the second projecting section being exposed.

According to this embodiment, the resin layer is formed on each surface of the semiconductor substrate. Therefore, since one of the resin layers shrinks (or expands) during curing so as to offset stress caused by the other resin layer, stress to be applied to the semiconductor substrate is reduced, whereby occurrence of warping or cracks can be prevented.

(2) In the method of manufacturing a semiconductor device, the through-hole electrode may include a first projecting section which projects from the first surface, and in the step (a), the first resin layer may be formed to be lower than the first projecting section.

This enables to reduce the level difference between the first resin layer and the first projecting section. Therefore, the semiconductor substrate can be maintained horizontally, whereby a thinning step can be performed stably.

(3) In the method of manufacturing a semiconductor device, the through-hole electrode may include a first projecting section which projects from the first surface, and in the step (a), the first resin layer may be formed to have a height equal to a height of the first projecting section.

This eliminates the level difference between the first resin layer and the first projecting section, whereby the first surface can be made flat. Therefore, the semiconductor substrate can be maintained horizontally, whereby a thinning step can be performed stably.

(4) In the method of manufacturing a semiconductor device, the step (b) may be performed in a state in which a reinforcement member is provided on a side of the first surface of the semiconductor substrate.

(5) In the method of manufacturing a semiconductor device, in the step (c), the second resin layer may be formed to be lower than the second projecting section.

This enables the through-hole electrodes in the adjacent semiconductor substrates to be securely bonded when stacking a plurality of the semiconductor substrates, whereby electrical connection reliability is improved.

(6) In the method of manufacturing a semiconductor device, a plurality of the integrated circuits may be formed in the semiconductor substrate, and the through-hole electrode may be formed corresponding to each of the integrated circuits, the method may further comprise cutting the semiconductor substrate along a cutting region.

(7) In the method of manufacturing a semiconductor device, in the step (a), the first resin layer may be formed to avoid at least a part of the cutting region of the semiconductor substrate.

This enables the semiconductor substrate to be easily cut, whereby occurrence of chipping or cracks can be prevented. If the first resin layer is not exposed (or the first resin layer is exposed to only a small extent) to the cutting surface, the first resin layer can be prevented from being removed from the first surface.

(8) In the method of manufacturing a semiconductor device, in the step (c), the second resin layer may be formed to avoid at least a part of the cutting region of the semiconductor substrate.

This enables the semiconductor substrate to be easily cut, whereby occurrence of chipping or cracks can be prevented. If the second resin layer is not exposed (or the second resin layer is exposed to only a small extent) to the cutting surface, the second resin layer can be prevented from being removed from the second surface.

(9) The method of manufacturing a semiconductor device may further comprise:

stacking a plurality of the semiconductor substrates for which the steps (a) to (c) have been completed, and electrically connecting adjacent semiconductor substrates among the stacked semiconductor substrates with each other through the through-hole electrode.

(10) The method of manufacturing a semiconductor device may further comprise:

filling a resin into a space between the adjacent semiconductor substrates.

This enables the bonding state between the adjacent semiconductor substrates to be maintained and reinforced.

(11) In the method of manufacturing a semiconductor device, the first and second resin layers and the resin may be formed of the same material.

This enables occurrence of interfacial separation caused by different types of materials to be prevented.

(12) According to another embodiment of the present invention, there is provided a semiconductor device comprising:

a semiconductor substrate which includes a first surface and a second surface, an integrated circuit being formed in the first surface, the second surface being opposite to the first surface;

a through-hole electrode which includes a first projecting section projected from the first surface, and a second projecting section projected from the second surface;

a first resin layer formed on the first surface of the semiconductor substrate so as to avoid the first projecting section; and a second resin layer which is formed on the second surface of the semiconductor substrate with at least a part of a surface of the second projecting section being exposed.

According to this embodiment, the resin layer is formed on each surface of the semiconductor substrate. Therefore, since one of the resin layers shrinks (or expands) during curing so as to offset stress caused by the other resin layer, stress to be applied to the semiconductor substrate is reduced, whereby occurrence of warping or cracks can be prevented.

(13) In the semiconductor device, the first resin layer may be formed to be lower than the first projecting section.

(14) In the semiconductor device, the first resin layer may be formed to have a height equal to a height of the first projecting section.

(15) In the semiconductor device, the second resin layer may be formed to be lower than the second projecting section.

This enables the through-hole electrodes in the adjacent semiconductor devices to be securely bonded when stacking a plurality of the semiconductor devices, whereby electrical connection reliability is improved.

(16) In the semiconductor device, a plurality of the integrated circuits may be formed in the semiconductor substrate, and the through-hole electrode may be formed corresponding to each of the integrated circuits.

(17) In the semiconductor device, at least one of the first and second resin layers may be formed to avoid at least a part of a cutting region of the semiconductor substrate, the cutting region being provided for obtaining a plurality of chips.

This enables the semiconductor substrate to be easily cut, whereby occurrence of chipping or cracks can be prevented. If the resin layer is not exposed (or the resin layer is exposed to only a small extent) to the cutting surface, the resin layer can be prevented from being removed from the first surface.

(18) According to a further embodiment of the present invention, there is provided a semiconductor device comprising:

a plurality of the above described semiconductor devices, the semiconductor devices being stacked, wherein adjacent semiconductor devices among the stacked semiconductor devices are electrically connected with each other through the through-hole electrode.

(19) In the semiconductor device, a resin may be filled into a space between the adjacent semiconductor devices.

This enables the bonding state between the adjacent semiconductor devices to be maintained and reinforced.

(20) In the semiconductor device, the first and second resin layers and the resin may be formed of the same material.

This enables occurrence of interfacial separation caused by different types of materials to be prevented.

(21) According to still another embodiment of the present invention, there is provided a circuit board on which one of the above described semiconductor devices is mounted.

(22) According to a still further embodiment of the present invention, there is provided an electronic instrument comprising one of the above described semiconductor devices.

The embodiments of the present invention are described below with reference to the drawings.

Figure 5:
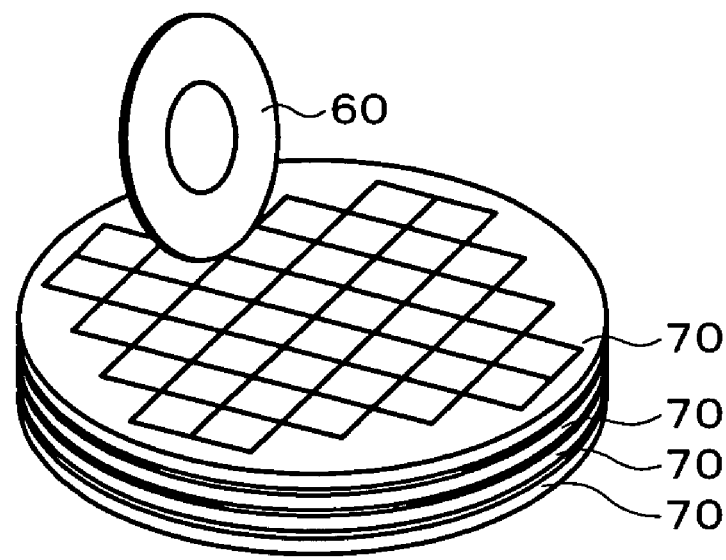
FIG. 5 is a view illustrating a method of manufacturing a semiconductor device according to an embodiment of the present invention.
Figure 6:
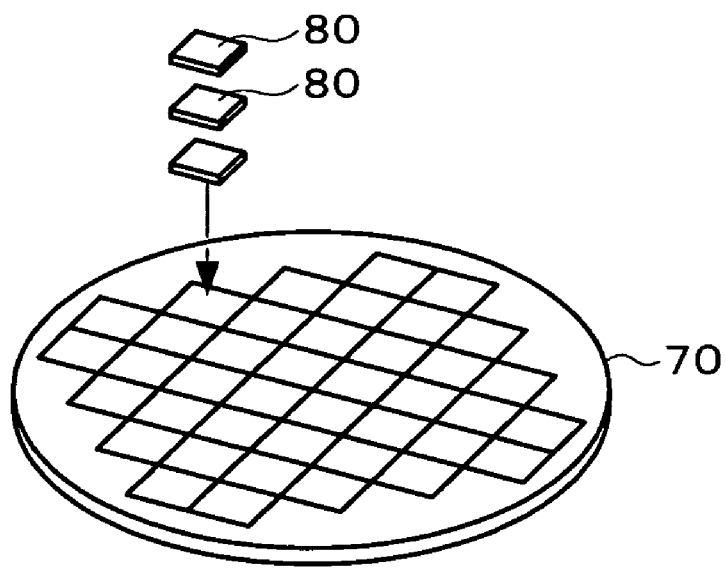
FIG. 6 is a view illustrating a method of manufacturing a semiconductor device according to an embodiment of the present invention.
Figure 7:
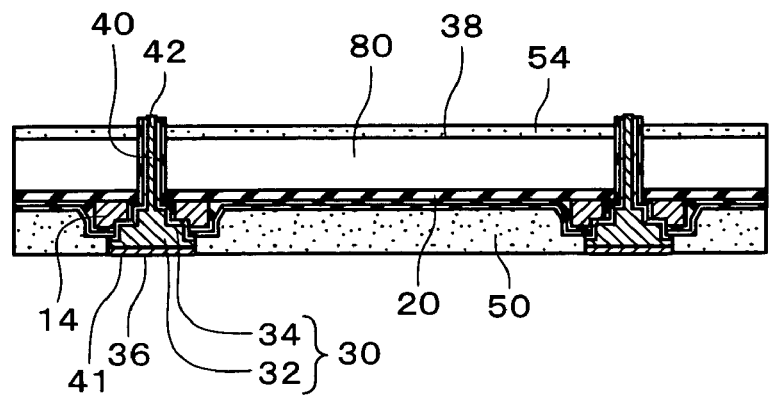
FIG. 7 is a view illustrating a semiconductor device according to an embodiment of the present invention.
Figure 8:
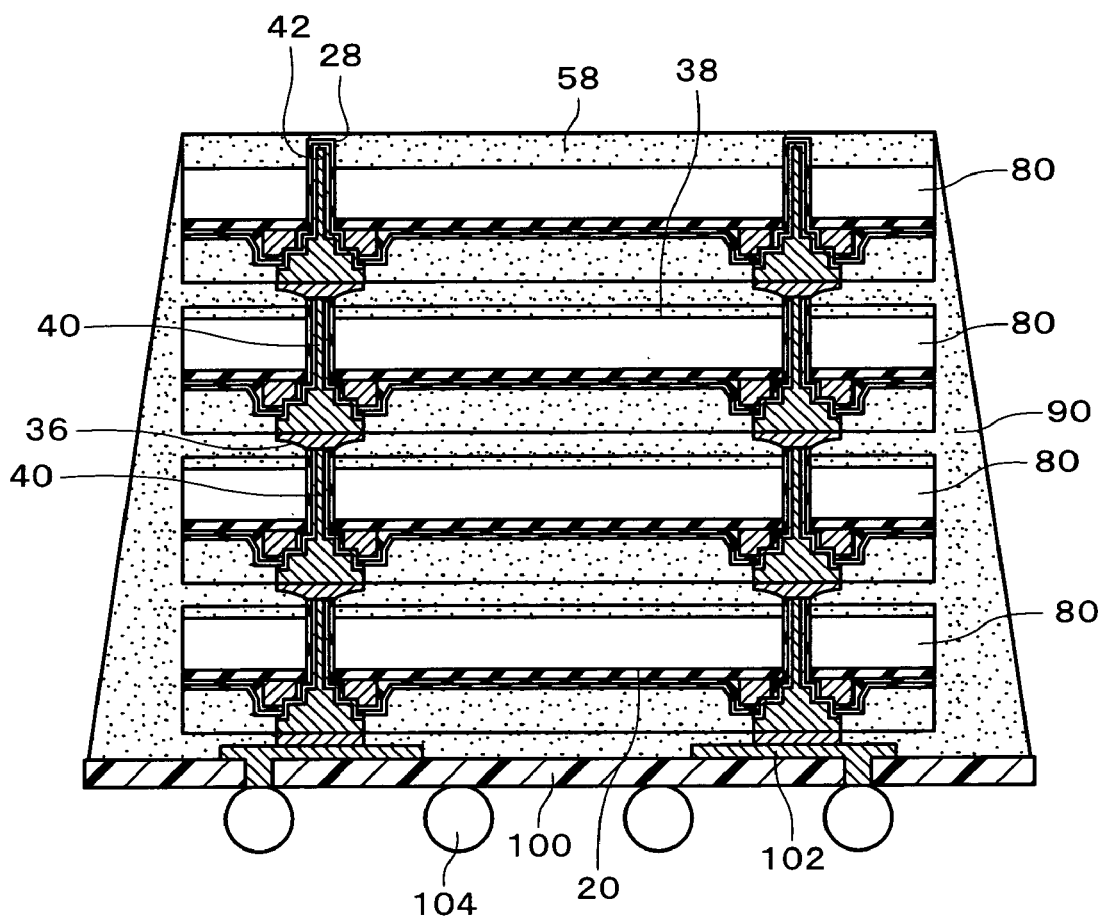
FIG. 8 is another view illustrating a semiconductor device according to an embodiment of the present invention.

FIGS. 1A to 8 are views illustrating a method of manufacturing a semiconductor device according to an embodiment to which the present invention is applied. FIGS. 7 and 8 are views also illustrating a semiconductor device. FIG. 4B is a cross-sectional view along the line IVB—IVB shown in FIG. 4A. In the present embodiment, a semiconductor substrate 10 is used. At least a part or the entirety of an integrated circuit 12 (circuit including a transistor or memory, for example) is formed in the semiconductor substrate 10. At least a part of each of a plurality of integrated circuits 12 may be formed in the semiconductor substrate 10, or at least a part of one integrated circuit 12 may be formed in the semiconductor substrate 10. A plurality of electrodes 14 (pads, for example) are formed on the semiconductor substrate 10. The electrode 14 is electrically connected with the integrated circuit 12. The electrode 14 may be formed of aluminum. The shape of the surface of the electrode 14 is not limited, and is generally quadrilateral.

One or more layers of passivation films 16 and 18 are formed on the semiconductor substrate 10. The passivation films 16 and 18 may be formed of $SiO_2$, SiN, or a polyimide resin, for example. In the example shown in FIG. 1A, the electrode 14 and an interconnect (not shown) which connects the integrated circuit 12 with the electrode 14 are formed on the passivation film 16. The passivation film 18 is formed to avoid at least a part of the surface of the electrode 14. The passivation film 18 may be formed to cover the surface of the electrode 14, and a part of the electrode 14 may be exposed by etching a part of the passivation film 18. The passivation film 18 may be etched by either dry etching or wet etching. The surface of the electrode 14 may be etched when etching the passivation film 18.

Figure 1B:
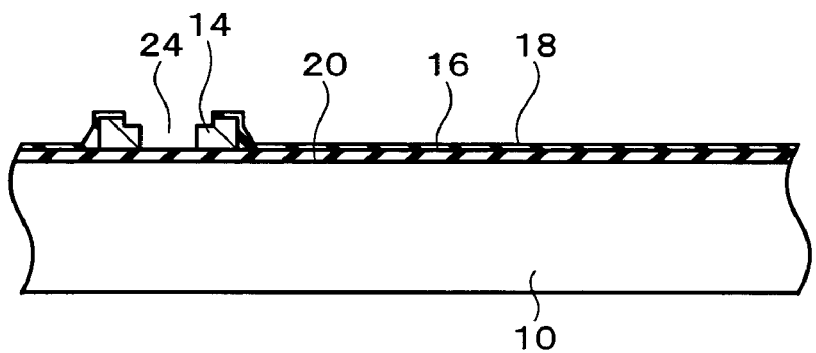

In the present embodiment, a recess section 22 (see FIG. 1C) is formed in the semiconductor substrate 10 from a first surface 20. The first surface 20 is a surface on the side on which the electrode 14 is formed (side on which the integrated circuit 12 is formed). The recess section 22 is formed to avoid a device and an interconnect of the integrated circuit 12. As shown in FIG. 1B, a through-hole 24 may be formed through the electrode 14. The through-hole 24 may be formed by etching (dry etching or wet etching). The through-hole 24 may be etched after forming a resist (not shown) patterned by a lithographic step. In the case where the passivation film 16 is formed under the electrode 14, a through-hole 26 (see FIG. 1C) is formed through the passivation film 16. In the case where etching of the electrode 14 stops at the passivation film 16, the through-hole 26 may be formed by using an etchant differing from the etchant used when etching the electrode 14. In this case, a resist (not shown) patterned by a lithographic step may be formed.

Figure 1C:
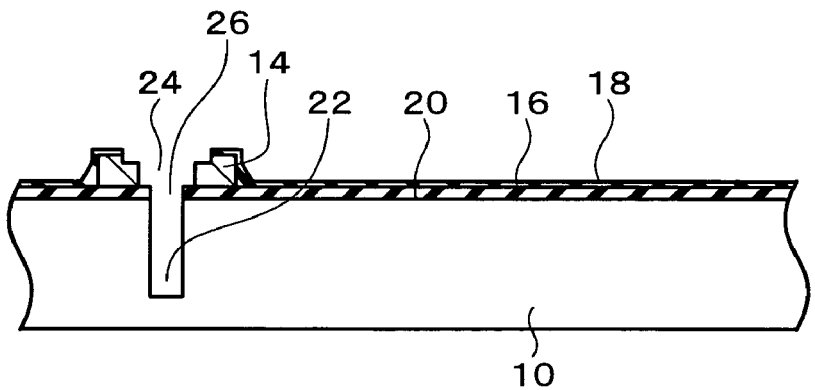

As shown in FIG. 1C, the recess section 22 is formed in the semiconductor substrate 10 so as to communicate with the through-hole 24 (and through-hole 26). The through-hole 24 (and through-hole 26) and the recess section 22 may be collectively referred to as a recess section. The recess section 22 may be formed by etching (dry etching or wet etching). The recess section 22 may be etched after forming a resist (not shown) patterned by a lithographic step. A laser ($CO_2$ laser or YAG laser, for example) may be used to form the recess section 22. A laser may be used to form the through-holes 24 and 26. The recess section 22 and the through-holes 24 and 26 may be continuously formed by using one type of etchant or laser. A sand blasting process may be used to form the recess section 22.

Figure 1D:
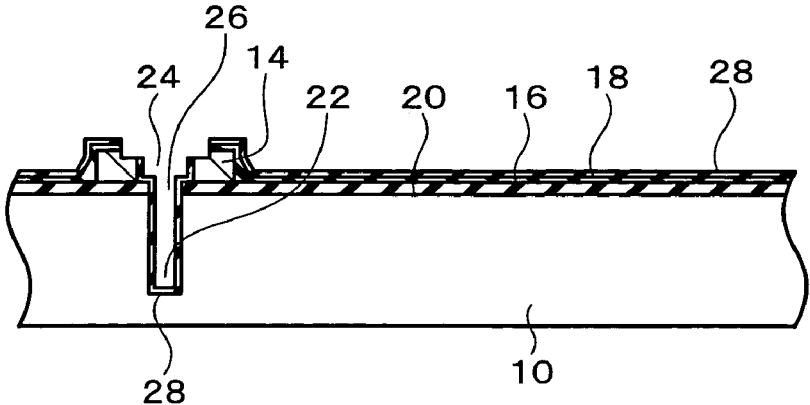

As shown in FIG. 1D, an insulating layer 28 may be formed inside the recess section 22. The insulating layer 28 may be an oxide film. In the case where the semiconductor substrate 10 is formed of Si, the insulating layer 28 may be formed of $SiO_2$ or SiN. The insulating layer 28 is formed on the bottom surface of the recess section 22. The insulating layer 28 is also formed on the inner wall surface of the recess section 22. The insulating layer 28 is formed so that the recess section 22 is not filled with the insulating layer 28. Specifically, a recess section is formed by the insulating layer 28. The insulating layer 28 may be formed on the inner wall surface of the through-hole 26 in the passivation film 16. The insulating layer 28 may be formed on the passivation film 18.

The insulating layer 28 may be formed on the inner wall surface of the through-hole 24 in the electrode 14. The insulating layer 28 is formed to avoid a part (upper surface, for example) of the electrode 14. The insulating layer 28 may be formed to cover the entire surface of the electrode 14, and a part of the electrode 14 may be exposed by etching (dry etching or wet etching) a part of the insulating layer 28. The insulating layer 28 may be etched after forming a resist (not shown) patterned by a lithographic step.

Figure 2A:
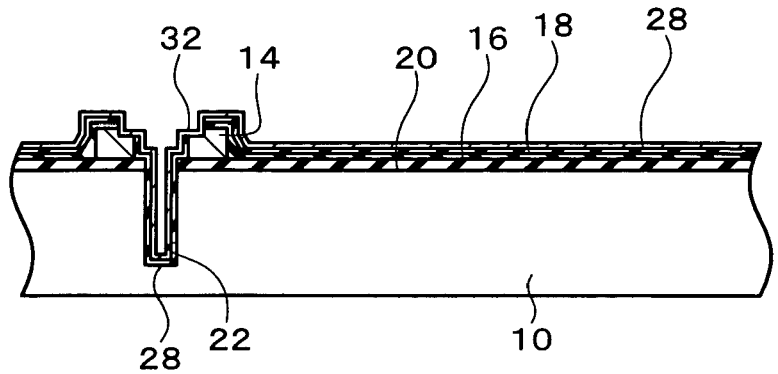
FIGS. 2A to 2D are views illustrating a method of manufacturing a semiconductor device according to an embodiment of the present invention.

A conductive section 30 (see FIG. 2B) is formed in the recess section 22 (inner side of the insulating layer 28, for example). The conductive section 30 may be formed of Cu, W, or the like. After forming an outer layer section 32 of the conductive section 30 as shown in FIG. 2A, a center section 34 of the conductive section 30 may be formed. The center section 34 may be formed of Cu, W, or doped polysilicon (low-temperature polysilicon, for example). The outer layer section 32 may include at least a barrier layer. The barrier layer prevents the material for the center section 34 or a seed layer described below from diffusing into the semiconductor substrate 10 (Si, for example). The barrier layer may be formed of a material differing from the material for the center section 34 (TiW or TiN, for example). In the case of forming the center section 34 by electroplating, the outer layer section 32 may include a seed layer. The seed layer is formed after forming the barrier layer. The seed layer is formed of the same material as the material for the center section 34 (Cu, for example). The conductive section 30 (at least the center section 34) may be formed by electroless plating or using an ink-jet method.

Figure 2B:
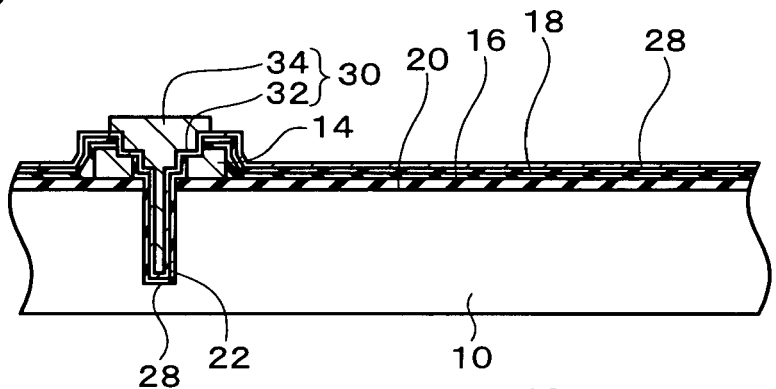
Figure 2C:
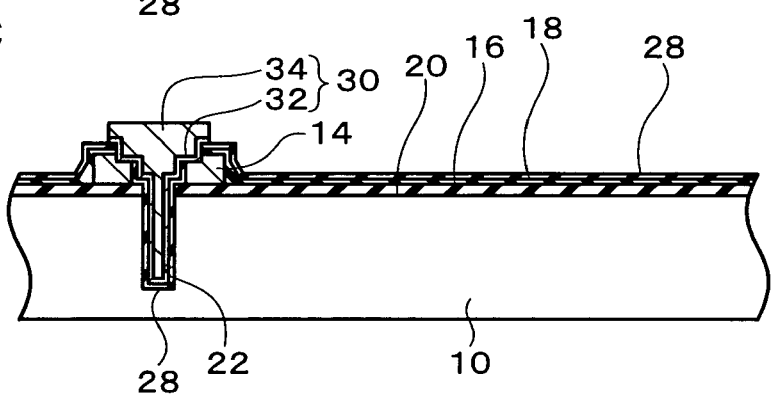

As shown in FIG. 2B, in the case where the outer layer section 32 is also formed on the passivation film 18, the outer layer section 32 is etched in the area formed on the passivation film 18 (and insulating layer 28), as shown in FIG. 2C. The conductive section 30 can be formed by forming the center section 34 after forming the outer layer section 32. A part of the conductive section 30 is located inside the recess section 22 in the semiconductor substrate 10. Since the insulating layer 28 is present between the inner wall surface of the recess section 22 and the conductive section 30, the inner wall surface of the recess section 22 is electrically insulated from the conductive section 30. The conductive section 30 is electrically connected with the electrode 14. The conductive section 30 may be in contact with the exposed section of the electrode 14 from the insulating layer 28, for example. A part of the conductive section 30 may be located on the passivation film 18. The conductive section 30 may be formed only inside the region of the electrode 14. The conductive section 30 may project over at least the recess section 22. The conductive section 30 may project from the passivation film 18 (and insulating layer 28), for example.

As a modification, the center section 34 may be formed in a state in which the outer layer section 32 is allowed to remain on the passivation film 18. In this case, since a layer continuous with the center section 34 is also formed over the passivation film 18, this layer is etched.

Figure 2D:
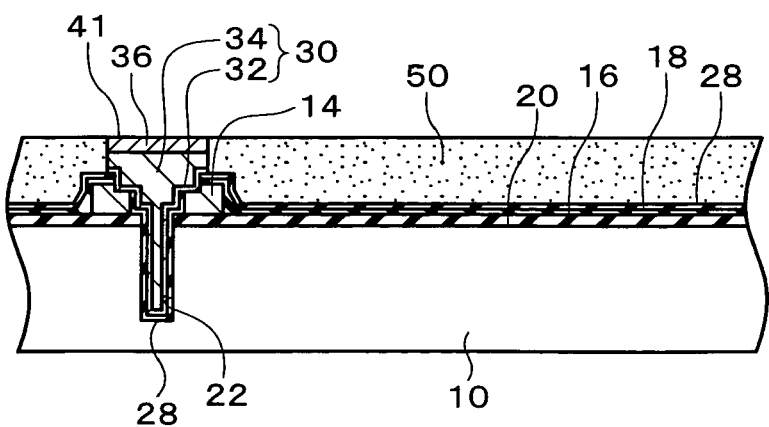

As shown in FIG. 2D, a filler metal 36 may be provided on the conductive section 30. In more detail, the filler metal 36 is provided on the end face of the conductive section 30 which projects from the first surface 20. The filler metal 36 is formed of solder, for example. The filler metal 36 may be formed of either soft solder or hard solder. The filler metal 36 may be formed while covering the region other than the conductive section 30 with a resist.

A first projecting section 41 which projects from the first surface 20 of the semiconductor substrate 10 can be formed in this manner. The first projecting section 41 is a part of the conductive section 30. In the example shown in FIG. 2D, the first projecting section 41 further includes the filler metal 36. The first projecting section 41 also projects from the surrounding passivation films 16 and 18 (and insulating layer 28). The first projecting section 41 may be disposed over the electrode 14.

Figure 3A:
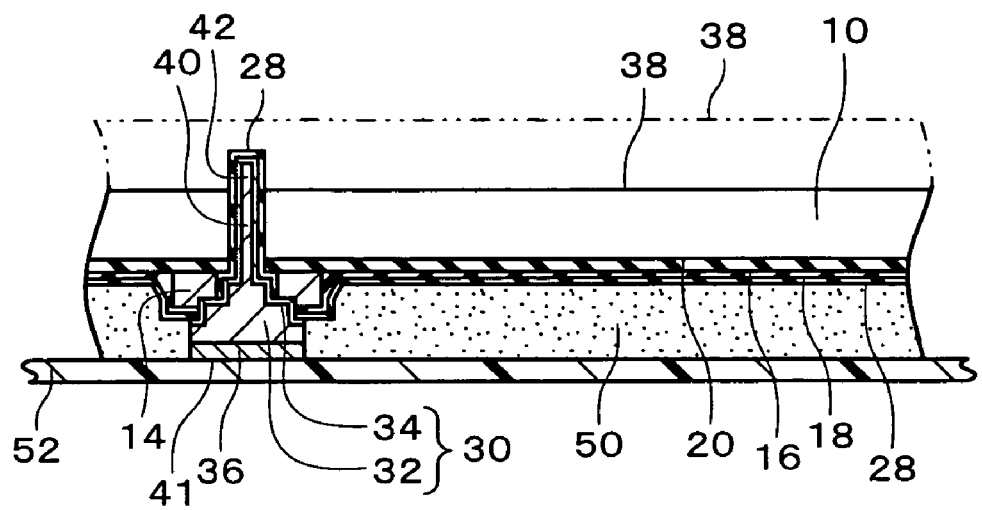
FIGS. 3A and 3B are views illustrating a method of manufacturing a semiconductor device according to an embodiment of the present invention.

In the present embodiment, a first resin layer 50 is formed on the first surface 20 (on the passivation films 16 and 18 and the insulating layer 28, for example) before a step of thinning the semiconductor substrate 10 (see FIG. 3A). The first resin layer 50 may be formed of the same material as a material for a resin 90 (epoxy resin, for example) used as an underfill as described later (see FIG. 8). The first resin layer 50 may contain a necessary amount of filler. The first resin layer 50 may be a thermosetting resin or a thermoplastic resin. The first resin layer 50 may be formed of a single layer or a plurality of layers. The first resin layer 50 may have a stress relief function. The first resin layer 50 may have light-shielding properties. The first resin layer 50 may be formed by using a spin coater, or may be formed by chemical vapor deposition (CVD), potting, a printing method, or an ink-jet method. As shown in FIG. 2D, the first resin layer 50 may be formed to avoid the first projecting section 41. In this case, the first resin layer 50 may be formed in only the region which avoids the first projecting section 41 by using an ink-jet method or mask processing. A resin may be provided in the region including the first projecting section 41, and the first resin layer 50 may be formed by exposing the first projecting section 41 by etching or the like. As a modification, the first resin layer 50 may be formed to cover the first projecting section 41. Specifically, the thinning step may be performed in a state in which the first projecting section 41 is covered with the first resin layer 50. In this case, the first projecting section 41 is exposed from the first resin layer 50 during or before performing a step of stacking the semiconductor substrates 10.

The first resin layer 50 may be formed on the entire surface (or almost the entire surface) of the first surface 20 of the semiconductor substrate 10. However, the first resin layer 50 may be formed to avoid the first projecting section 41 as described above. The first resin layer 50 may be formed to avoid at least a part of an unnecessary portion of the semiconductor substrate 10 which is not used as a product (edge of a semiconductor wafer, for example).

The first resin layer 50 may be formed to cover (only) the region of the first surface 20 in which the integrated circuit 12 (active element, for example) is formed. In the case where the electrodes 14 are disposed corresponding to the integrated circuit 12, the first resin layer 50 may be formed to cover (only) each region enclosed by the electrodes 14. This enables the integrated circuit 12 to be protected from the outside environment, whereby reliability of the semiconductor device can be increased.

Figure 4A:
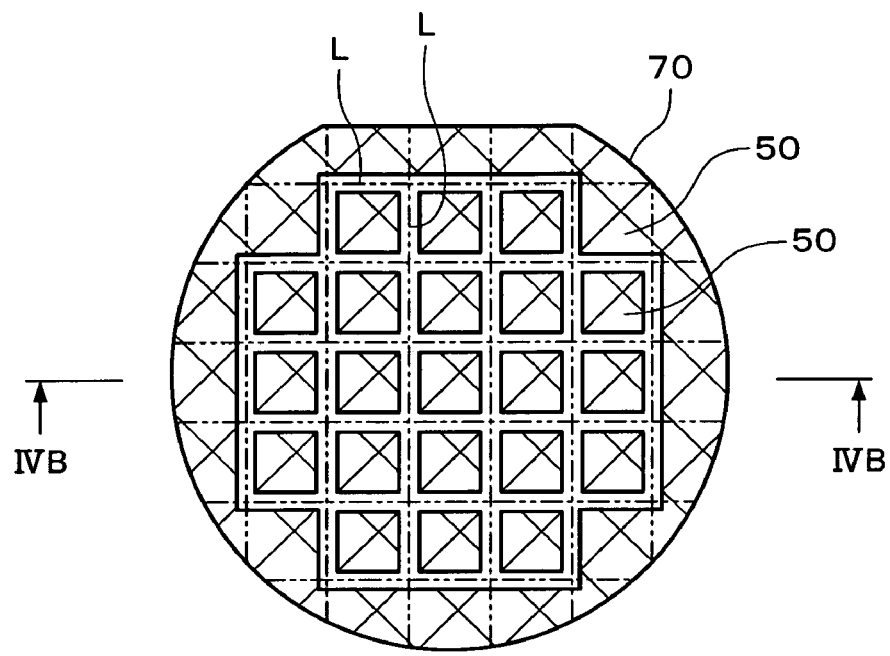
FIGS. 4A and 4B are views illustrating a method of manufacturing a semiconductor device according to an embodiment of the present invention.

In the case where the semiconductor substrate 10 (semiconductor wafer, for example) is cut in a subsequent step, the first resin layer 50 may be formed to avoid at least a part or the entirety of the cutting region L (dicing line, for example) (see FIG. 4A). This enables the semiconductor substrate 10 to be easily cut, whereby occurrence of chipping or cracks can be prevented. If the first resin layer 50 is not exposed (or exposed to only a small extent) to the cutting surface, the first resin layer 50 can be prevented from being removed from the first surface 20. The region of the cutting region L which passes through the unnecessary portion of the semiconductor substrate 10 which is not used as a product (edge of the semiconductor wafer, for example) may be covered with the first resin layer 50 (see FIG. 4A). If the first resin layer 50 is divided into a plurality of regions as shown in FIG. 4A, stress caused by cure shrinkage of the resin can be dispersed.

The first resin layer 50 may be formed to have the same height (or almost the same height) as the first projecting section 41. Specifically, the first surface 20 may be formed flat by eliminating the level difference between the first resin layer 50 and the first projecting section 41. The first resin layer 50 may be formed to be lower than the first projecting section 41. Specifically, the level difference between the first resin layer 50 and the first projecting section 41 may be reduced. The first resin layer 50 may be formed so that the surface of the first resin layer 50 is flat (to a uniform thickness, for example). The first resin layer 50 may be formed to become thinner as the distance from the first projecting section 41 is increased.

As shown in FIG. 3A, the semiconductor substrate 10 is made thinner by removing a part of the second surface 38 (surface opposite to the first surface 20). The second surface 38 may be removed by at least either a mechanical method or a chemical method, for example. The surface of the semiconductor substrate 10 may be ground or polished by using a grindstone or the like, or may be etched. The removal step of the semiconductor substrate 10 may be separately performed two or more times. The semiconductor substrate 10 may be ground or polished in the first removal step before the insulating layer 28 formed in the recess section 22 is exposed, and the insulating layer 28 may be exposed in the subsequent removal step, for example.

As shown in FIG. 3A, the second surface 38 of the semiconductor substrate 10 may be etched so that the conductive section 30 projects in a state in which the conductive section 30 (section inside the recess section 22 in more detail) is covered with the insulating layer 28. The second surface 38 may be etched by using an etchant having properties which allow the amount of etching for the semiconductor substrate 10 (Si, for example) to be greater than the amount of etching for the insulating layer 28 ($SiO_2$, for example). The etchant may be $SF_6$, $CF_4$, or $Cl_2$ gas. Etching may be performed by using a dry etching device. The etchant may be a mixed solution of hydrofluoric acid and nitric acid or a mixed solution of hydrofluoric acid, nitric acid, and acetic acid.

As shown in FIG. 3A, the thinning step may be performed in a state in which a reinforcement member 52 is provided on the side of the first surface 20 of the semiconductor substrate 10. In the case where the thinning step includes a plurality of removal steps, at least one of the removal steps (grinding or polishing step, for example) may be performed in a state in which the reinforcement member 52 is provided. In the present embodiment, since the first surface 20 of the semiconductor substrate 10 is flat, the semiconductor substrate 10 can be held horizontally by the reinforcement member 52, whereby the thinning step (grinding or polishing step, for example) can be performed stably. Moreover, since there is no (or only a small) level difference between the first resin layer 50 and the first projecting section 41, a part of the reinforcement member 52 (adhesive material (adhesive tape or liquid adhesive), for example) can be prevented from adhering to and remaining around the first projecting section 41.

As shown in FIG. 3A, the reinforcement member 52 may be a flexible substrate which is easily bent (tape, for example), or a rigid substrate which is rarely bent (plastic plate or glass plate, for example). The reinforcement member 52 may exhibit adhesion. The adhesive material may be an adhesive tape (UV tape, for example), or a liquid adhesive (UV adhesive, for example). A liquid adhesive may be provided on the surface of a flexible substrate or a rigid substrate. In the case where the reinforcement member 52 is a flexible substrate, a ring is generally provided on the outer circumferential edge.

This enables the through-hole electrode 40 which includes the first projecting section 41, which projects from the first surface 20, and the second projecting section 42, which projects from the second surface 38, to be formed. The end face of the second projecting section 42 is exposed in the step described later. The through-hole electrode 40 is formed through the first and second surfaces 20 and 38. The width of the first projecting section 41 may be greater than the width of the second projecting section 42.

Figure 3B:
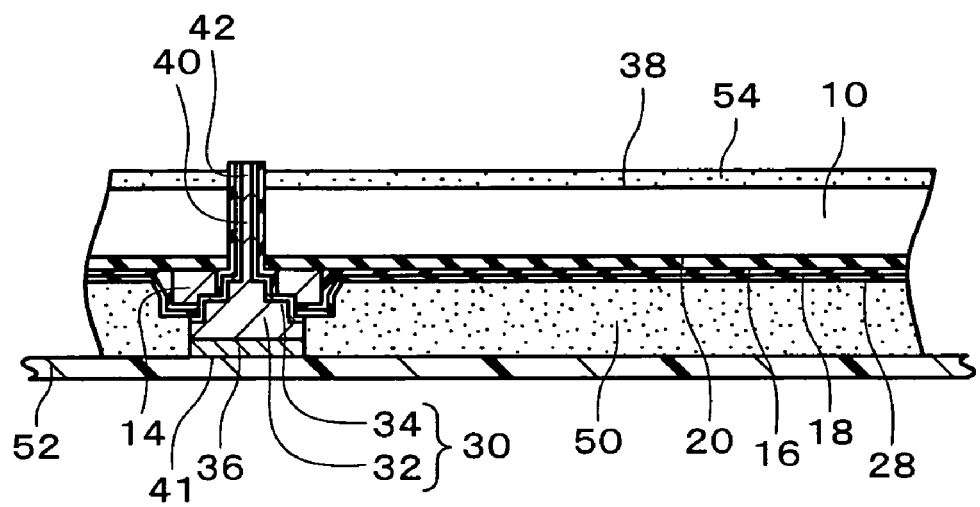

As shown in FIG. 3B, a second resin layer 54 is formed on the second surface 38 of the semiconductor substrate 10. The second resin layer 54 may be formed in a state in which the reinforcement member 52 is provided. The second resin layer 54 may have the same (or similar) properties as those of the first resin layer 50 (coefficient of linear expansion, for example). The second resin layer 54 may be formed of the same material as the material for the first resin layer 50. The second resin layer 54 may be a thermosetting resin or a thermoplastic resin. The second resin layer 54 may be formed of a single layer or a plurality of layers. The second resin layer 54 may have a stress relief function. The second resin layer 54 may have light-shielding properties. The description of the formation method of the first resin layer 50 may be applied to the formation method of the second resin layer 54. The second resin layer 54 is formed to avoid the second projecting section 42. The details are the same as described in the formation method of the first resin layer 50.

The second resin layer 54 may be formed on the entire second surface 38 (or almost the entire surface) of the semiconductor substrate 10 so as to avoid the second projecting section 42. The second resin layer 54 may be formed to avoid at least a part of an unnecessary portion of the semiconductor substrate 10 which is not used as a product (edge of the semiconductor wafer, for example).

The second resin layer 54 may be formed to cover (only) the region of the second surface 38 which overlaps the region in which the integrated circuit 12 is formed. The second resin layer 54 may be formed to avoid at least a part or the entire cutting region L (dicing line, for example) of the semiconductor substrate 10. This enables the semiconductor substrate 10 to be easily cut, whereby occurrence of chipping or cracks can be prevented. If the second resin layer 54 is not exposed (or exposed to only a small extent) to the cutting surface, the second resin layer 54 can be prevented from being removed from the second surface 38. The second resin layer 54 may be divided into a plurality of regions. The description of the first resin layer 50 may be applied to the details of the formation method of the second resin layer 54.

As shown in FIG. 3B, the second resin layer 54 may be formed to be lower than the second projecting section 42. Specifically, the second resin layer 54 may be formed so that the second projecting section 42 projects from the second resin layer 54. This enables the through-hole electrodes 40 of the stacked semiconductor substrates 10 to be securely bonded when stacking the semiconductor substrates 10, whereby electrical connection reliability is improved (see FIG. 8). As a modification, the second resin layer 54 may be formed to have the same height (or almost the same height) as the second projecting section 42, or may be formed to be higher than the second projecting section 42. The second resin layer 54 may be formed to have a flat surface (have a uniform thickness, for example). The second resin layer 54 may be formed to be thinner as the distance from the second projecting section 42 increases.

In the case of forming the second resin layer 54 by etching, the second insulating layer 54 may be formed to cover the end face of the second projecting section 42, and the second resin layer 54 may be etched. In this case, the second resin layer 54 may be ground or polished before etching. The through-hole electrode 40 may be ground or polished continuously with or separately from grinding or polishing of the second resin layer 54. The second resin layer 54 may be formed in a state in which the through-hole electrode 40 is covered with the insulating layer 28 (see FIG. 3A), and the through-hole electrode 40 may be exposed by grinding or polishing the insulating layer 28.

The fresh surface of the through-hole electrode 40 (second projecting section 42 in more detail) may be exposed. For example, the second projecting section 42 may be ground or polished until the fresh surface (surface formed only of the constituent material, that is, surface from which an oxide film and a deposited organic substance are removed) is exposed. A grindstone may be used for grinding. For example, a grindstone having a grit of about #100 to #4000 may be used. Use of a grindstone having a grit of about #1000 to #4000 prevents breakage of the insulating layer 28. Abrasive cloth may be used for polishing. The abrasive cloth may be a suede type or foamed urethane type abrasive cloth, or may be nonwoven fabric. Slurry in which colloidal silica as an abrasive particle is dispersed in an alkaline cationic solution such as Na or $NH_4$ may be used for polishing. The abrasive particles may have a particle diameter of about 0.03 to 10 µm, and be dispersed at a percentage of about 10 wt %. The slurry may include an additive such as a chelating agent, ammonia, or a hydrogen peroxide aqueous solution. The abrasive pressure may be about 5 $g/cm^2$ to 1 $kg/cm^2$.

In the case where the insulating layer 28 is formed, the insulating layer 28 is ground or polished before grinding or polishing the through-hole electrode 40. The insulating layer 28 and the through-hole electrode 40 may be continuously polished or ground. The insulating layer 28 is removed at least in the area formed on the bottom surface of the recess section 22. The through-hole electrode 40 may be exposed, and the fresh surface of the through-hole electrode 40 may be further exposed. The fresh surface of the through-hole electrode 40 may be exposed, and the periphery of the end section of the through-hole electrode 40 may be covered with the insulating layer 28. The fresh surface of the outer layer section 32 (barrier layer, for example) may be exposed so that the fresh surface of the center section 34 of the through-hole electrode 40 is not exposed, or the fresh surfaces of the outer layer section 32 and the center section 34 may be exposed. A through-hole electrode excelling in electrical connection characteristics can be formed by exposing the fresh surface of the through-hole electrode 40. The through-hole electrode 40 may be electrically connected with another part before the fresh surface is oxidized (immediately after the fresh surface is exposed, or as soon as possible after the fresh surface is exposed (within 24 hours, for example)).

A semiconductor device (semiconductor wafer 70 (see FIG. 4A)) including the through-hole electrode 40 and the first and second resin layers 50 and 54 can be obtained by these steps, for example. In this case, a plurality of the integrated circuits 12 are formed in the semiconductor substrate 10, and the through-hole electrodes 40 are formed corresponding to each of the integrated circuits 12. The first and second resin layers 50 and 54 may be formed to avoid at least a part of the cutting region L. Or, a semiconductor device (semiconductor chip 80 (see FIGS. 4B and 7)) including the through-hole electrode 40 and the first and second resin layers 50 and 54 can be obtained. In this case, one integrated circuit 12 is formed in the semiconductor substrate 10. The detailed structure of the semiconductor wafer 70 and the semiconductor chip 80 may be derived from the above-described manufacturing method.

Figure 4B:
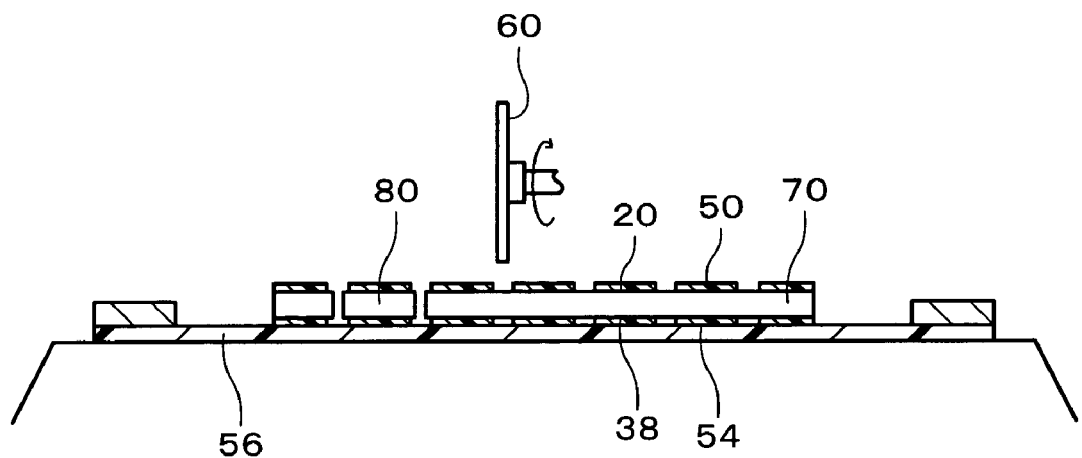

As shown in FIG. 4B, the semiconductor wafer 70 may be cut (diced, for example). The semiconductor wafer 70 is cut along the cutting region L of the semiconductor wafer 70. A cutter 60 (dicer, for example) or a laser ($CO_2$ laser or YAG laser, for example) may be used to cut the semiconductor wafer 70. The semiconductor wafer 70 may be cut from the side of the first surface 20 of the semiconductor substrate 10. In this case, the reinforcement member 56 may be provided on the side of the second surface 38. A plurality of semiconductor chips 80 including the through-hole electrode 40 and the first and second resin layers 50 and 54 are obtained from the semiconductor wafer 70 in this manner (see FIG. 7).

The method of manufacturing the semiconductor device may include a step of stacking the semiconductor substrates 10. As shown in FIG. 5, the semiconductor wafers 70 including the through-hole electrode 40 and the first and second resin layers 50 and 54 may be stacked. As shown in FIG. 6, the semiconductor chips 80 including the through-hole electrode 40 and the first and second resin layers 50 and 54 may be stacked. The semiconductor chip 80 including the through-hole electrode 40 and the first and second resin layers 50 and 54, and the semiconductor wafers 70 including the through-hole electrode 40 and the first and second resin layers 50 and 54 may be stacked.

Adjacent semiconductor substrates 10 among the stacked semiconductor substrates 10 are electrically connected through the through-hole electrodes 40. In more detail, the through-hole electrodes 40 on the upper and lower sides (first projecting section 41 of one semiconductor substrate and second projecting section 42 of the other semiconductor substrate in more detail) may be electrically connected. A solder junction or a metal junction, an anisotropic conductive material (anisotropic conductive film or anisotropic conductive paste), pressure welding utilizing the shrinkage force of an insulating adhesive, or a combination of these may be used to provide electrical connection.

FIG. 8 is a view showing a semiconductor device (stacked semiconductor device) according to an embodiment of the present invention. The stacked semiconductor device includes the semiconductor chips 80 including the through-hole electrode 40 and the first and second resin layers 50 and 54. The semiconductor chips 80 are stacked. Adjacent through-hole electrodes 40 or the through-hole electrode 40 and the electrode 14 may be bonded by a filler metal 36. The filler metal 36 is provided on the first projecting section 41 of one semiconductor chip 80, and placed on the second projecting section 42 of the other semiconductor chip 80. The resin layer (first or second resin layer 50 or 54) is formed on both surfaces (first and second surfaces 20 and 38) of the semiconductor chip 80. Therefore, since one resin layer (second resin layer 54, for example) shrinks (or expands) during curing so as to offset stress caused by the other resin layer (first resin layer 50, for example), stress applied to the semiconductor chip 80 is reduced, whereby occurrence of warping or cracks can be prevented. Moreover, even if the filler metal 36 flows (or separates and rolls) toward the peripheral region of the second projecting section 42, the filler metal 36 does not come in contact with the second surface 38 (semiconductor) of the semiconductor chip 80 since the second resin layer 54 is formed. Therefore, occurrence of short circuits or electrical failure caused by the filler metal 36 can be prevented.

The resin 90 (epoxy resin, for example) may be provided between the stacked semiconductor chips 80. The resin 90 is an underfill material, and maintains and reinforces the bonding state between the adjacent semiconductor substrates 10. The resin 90 may be provided to allow the space between the stacked semiconductor chips 80 to be filled therewith and to cover the side surfaces of the semiconductor chips 80. The resin 90 may be formed of the same material as the material for at least one of (preferably both of) the first and second resin layers 50 and 54. This enables occurrence of interfacial separation caused by different types of materials to be prevented. The resin 90 may be injected between the stacked semiconductor chips 80 by using a dispenser, needle, or the like.

The second projecting section 42 of one of the stacked semiconductor chips 80 (outermost semiconductor chip 80 in the direction of the second surface 38, for example) may be covered with the second resin layer 58. The second projecting section 42 may be covered with the insulating layer 28. According to the present embodiment, occurrence of warping or cracks of the uppermost semiconductor chip 80 can be particularly effectively prevented.

The stacked semiconductor chips 80 may be mounted on an interconnect substrate 100. The outermost semiconductor chip 80 among the stacked semiconductor chips 80 may be mounted on the interconnect substrate 100 (interposer, for example). The semiconductor chip 80 may be mounted by a face-down bonding. In this case, the semiconductor chip 80 having the outermost (lowermost, for example) through-hole electrode 40 in the direction of the first surface 20 is mounted on the interconnect substrate 100. For example, the first projecting section 41 of the through-hole electrode 40 or the electrode 14 may be electrically connected with (bonded to, for example) an interconnect pattern 102. The resin 90 may be provided between the semiconductor chip 80 and the interconnect substrate 100.

The stacked semiconductor chips 80 may be bonded face up to the interconnect substrate 100 (not shown). In this case, the second projecting section 42 of the through-hole electrode 40 projecting from the second surface 38 may be electrically connected with (bonded to, for example) the interconnect pattern 102. An external terminal 104 (solder ball, for example) electrically connected with the interconnect pattern 102 is formed on the interconnect substrate 100. A stress relief layer may be formed on the semiconductor chip 80. An interconnect pattern may be formed on the stress relief layer from the electrode 14, and the external terminal may be formed on the interconnect pattern. Other details may be derived from the above-described manufacturing method.

Figure 9:
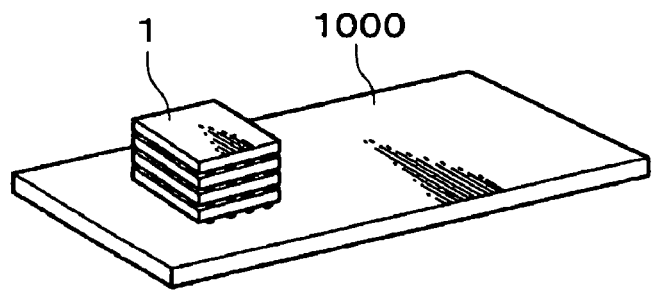
FIG. 9 is a view showing a circuit board according to an embodiment of the present invention.
Figure 10:
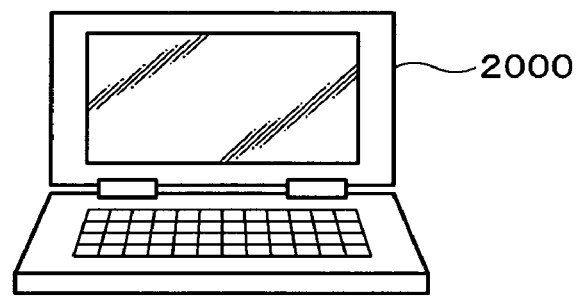
FIG. 10 is a view showing an electronic instrument according to an embodiment of the present invention.
Figure 11:
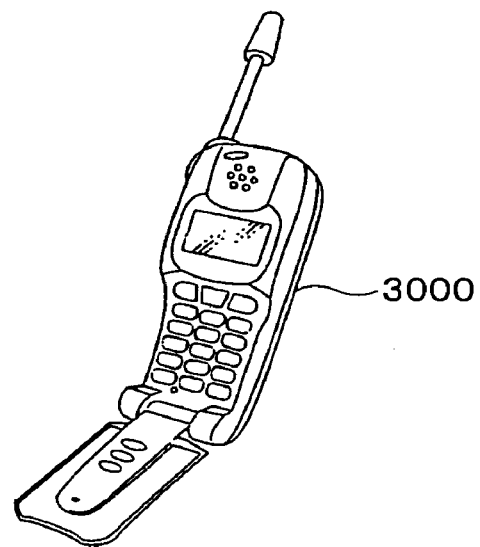
FIG. 11 is a view showing another electronic instrument according to an embodiment of the present invention.

FIG. 9 shows a circuit board 1000 on which a semiconductor device 1, in which a plurality of semiconductor chips are stacked, is mounted. The semiconductor chips are electrically connected through the through-hole electrodes 40. FIGS. 10 and 11 respectively show a notebook-type personal computer 2000 and a portable telephone 3000 as examples of electronic instruments including the above semiconductor device.

The present invention is not limited to the above-described embodiments. Various modifications and variations can be made. For example, the present invention includes configurations substantially the same as the configurations described in the embodiments (in function, in method and effect, or in objective and effect). The present invention also includes a configuration in which an unsubstantial portion in the above-described embodiments is replaced. The present invention also includes a configuration having the same effects as the configurations described in the embodiments, or a configuration capable of achieving the same objective. Further, the present invention includes a configuration in which a known technique is added to the configurations described in the embodiments.

What is claimed is:

1. A method of manufacturing a semiconductor device, comprising:
    (a) forming a first resin layer on a first surface of a semiconductor substrate, the semiconductor substrate having an integrated circuit being formed in the first surface and an electrode formed on the first surface, the electrode being electrically connected to the integrated circuit;
    (b) forming a through-hole in the electrode, forming a recess section in the semiconductor substrate, forming a through-hole electrode in the through-hole and the recess section, and then removing a part of the semiconductor substrate from a second surface opposite to the first surface to thin the semiconductor substrate such that the through-hole electrode has a second projecting section which projects from the second surface; and
    (c) forming a second resin layer on the second surface of the semiconductor substrate with at least a part of a surface of the second projecting section being exposed.

2. The method of manufacturing a semiconductor device as defined in claim 1,
    wherein the through-hole electrode includes a first projecting section which projects from the first surface, and
    wherein, in the step (a), the first resin layer is formed to be lower than the first projecting section.

3. The method of manufacturing a semiconductor device as defined in claim 1,
    wherein the through-hole electrode includes a first projecting section which projects from the first surface, and
    wherein, in the step (a), the first resin layer is formed to have a height equal to a height of the first projecting section.

4. The method of manufacturing a semiconductor device as defined in claim 1,
    wherein the step (b) is performed in a state in which a reinforcement member is provided on a side of the first surface of the semiconductor substrate.

5. The method of manufacturing a semiconductor device as defined in claim 1,
    wherein, in the step (c), the second resin layer is formed to be lower than the second projecting section.

6. The method of manufacturing a semiconductor device as defined in claim 1,
    wherein a plurality of the integrated circuits are formed in the semiconductor substrate, and the through-hole electrode is formed corresponding to each of the integrated circuits,
    the method further comprising cutting the semiconductor substrate along a cutting region.

7. The method of manufacturing a semiconductor device as defined in claim 6,
    wherein, in the step (a), the first resin layer is formed to avoid at least a part of the cutting region of the semiconductor substrate.

8. The method of manufacturing a semiconductor device as defined in claim 6,
    wherein, in the step (c), the second resin layer is formed to avoid at least a part of the cutting region of the semiconductor substrate.

9. The method of manufacturing a semiconductor device as defined in claim 1, further comprising:
    stacking a plurality of the semiconductor substrates for which the steps (a) to (c) have been completed, and electrically connecting adjacent semiconductor substrates among the stacked semiconductor substrates with each other through the through-hole electrode.

10. The method of manufacturing a semiconductor device as defined in claim 9, further comprising:
    filling a resin into a space between the adjacent semiconductor substrates.

11. The method of manufacturing a semiconductor device as defined in claim 10,
    wherein the first and second resin layers and the resin are formed of the same material.

* * * * *